United States Patent [19]

Vokey et al.

[11] Patent Number: 5,077,526
[45] Date of Patent: Dec. 31, 1991

[54] CABLE FAILURE DETECTION SYSTEM

[75] Inventors: David E. Vokey, Tolland, Conn.; Kenneth N. Sontag, Winnipeg, Canada

[73] Assignee: Automated Light Technologies, Inc., Waterbury, Conn.

[21] Appl. No.: 512,318

[22] Filed: Apr. 23, 1990

Related U.S. Application Data

[63] Continuation-in-part of Ser. No. 339,967, Apr. 19, 1989, abandoned, which is a continuation of Ser. No. 175,251, Mar. 30, 1988, abandoned.

[51] Int. Cl.⁵ .................. G01R 31/10; G08B 21/00
[52] U.S. Cl. .................................. 324/541; 324/544; 340/604
[58] Field of Search ............. 174/11 R; 340/604, 605; 324/541, 544, 522, 525

[56] References Cited

U.S. PATENT DOCUMENTS

| | | |
|---|---|---|
| 2,056,085 | 9/1936 | Alles . |
| 3,299,351 | 1/1967 | Williams . |
| 3,662,367 | 9/1972 | De Veau, Jr. et al. . |
| 4,001,674 | 1/1977 | Schneider . |
| 4,051,436 | 9/1977 | Wier . |
| 4,144,487 | 3/1979 | Pharney ........................... 324/522 |
| 4,157,541 | 6/1979 | Harwell . |
| 4,214,311 | 7/1980 | Nakashima . |
| 4,386,231 | 5/1983 | Vokey . |
| 4,480,251 | 10/1984 | McNaughton ..................... 340/605 |
| 4,695,787 | 9/1987 | Billet ................................. 340/605 |
| 4,721,916 | 1/1988 | Hanawasa . |

FOREIGN PATENT DOCUMENTS

| | | |
|---|---|---|
| 1290985 | 3/1969 | Fed. Rep. of Germany ...... 340/604 |
| 1913125 | 9/1970 | Fed. Rep. of Germany ...... 340/604 |
| 0055271 | 3/1985 | Japan . |
| 0195462 | 10/1985 | Japan . |
| 182339 | 7/1922 | United Kingdom . |
| 182340 | 7/1922 | United Kingdom . |
| 2082406 | 3/1982 | United Kingdom . |

OTHER PUBLICATIONS

K. Sontag and A. Ross: "Manitoba Telephone Keeps FO Cables Dry", Telephony, Apr. 6, 1987, pp. 449-453.
Article-Apr. 6, 1987, "Manitoba Telephone Keeps Cables Dry with Special Monitoring System", by A. J. Ross and K. Sontag, reprinted from Telephony, Apr. 6, 1987, copyright 1987 by Telephony Div., Intertec Pub. Corp., Chicago, Ill.

*Primary Examiner*—Kenneth A. Wieder
*Assistant Examiner*—Jose M. Solis
*Attorney, Agent, or Firm*—Murray E. Thrift; Stanley G. Ade; Adrian D. Battison

[57] ABSTRACT

A system is provided for monitoring a communications cable for moisture penetration. A line signal generator is connected to a metal armour layer of the cable to apply a line signal to the armour. Changes in the line signal current are monitored to detect the condition of the cable. Moisture penetration can be monitored throughout the length of the cable. The armour layer is maintained at a negative potential with respective ground. This provides an additional cathodic protection to the cable.

4 Claims, 2 Drawing Sheets

CABLE FAILURE DETECTION SYSTEM

CROSS REFERENCE TO RELATED APPLICATIONS

This application is a continuation-in-part of application Ser. No. 339,967, filed Apr. 19, 1989, now abandoned, which is a continuation of application Ser. No. 175,251, filed Mar. 30, 1988, now abandoned.

FIELD OF THE INVENTION

The present invention relates to cable monitoring systems and more particularly to cable monitoring systems for detecting moisture penetration into a communications cable.

BACKGROUND

Water or moisture penetration into any outside cable plant can cause communications circuits to fail. Outages often occur at the most inopportune time and are costly to locate and repair. The presence of water in the cable may cause a variety of problems including the short circuiting of copper pairs and degradation of mechanical components of the cable. With fiber optic cable, freezing of penetrated water may cause rupture of the fibers and the water may attack and separate the fiber coatings. This may result in increased microbending and attenuation, stress, fatigue, and ultimate failure of the fibers.

A wide range of materials and methods have been employed with varying degrees of success, in an effort to maintain outside cable plant. These include pressurization, the use of double enclosures and encapsulation. All of these techniques are costly and do not provide for the detection of water entry.

In addition, pressurization is ineffective on fiber optic cables while double enclosures are bulky and encapsulating materials are messy to handle.

A modern communication cable is constructed with a waterproof sheath, protecting the cable core. In most cases, the cable sheath incorporates one or more layers of metal armour encased in waterproof layers of plastic, for example, polyethylene. In optical fibre cables, the core usually incorporates a central strength member which may be steel or dielectric. The modern communication cables are usually "filled" with a water-blocking jelly to keep water out. No moisture-absorbant materials are allowed.

While it has been proposed in the past to produce electrical cables such as those described in Alles U.S. Pat. No. 2,056,085 and in Vokey U.S. Pat. No. 4,386,231 which incorporate special moisture-detecting conductors, such cables are undesirable from the point of view of the user because their special construction makes them more costly. The Alles construction is also not acceptable because it incorporates an absorbent material. A further difficulty arises with fibre optic cables, where the small physical size of the cable core makes it unsuitable for wrapping with a moisture-detecting tape such as that described in Vokey. Of even more importance is the fact that using the prior art monitoring techniques, for example that described in McNaughton et al U.S. Pat. No. 4,480,251 only the especially constructed cables can be monitored. This means that the very large quantity of existing conventional cable cannot readily be monitored for moisture penetration. The disclosure of the McNaughton et al patent is incorporated herein by reference.

Another disadvantage of the known cables and systems is the location of the detecting condutors inside the protective sheath of the cable. This means that the presence of moisutre cannot be detected until after it has prenetrated the entire sheath, including the Waterproof plastic layers and cable armour.

The present invention is concerned with the provision of a system for monitoring a communications cable of the conventional type, that is without special moisture-detecting conductors built into it, for moisture penetration. The system is intended to provide an early detection of any moisture penetration or physical damage to the cable armour.

The present invention provides a moisture-detecting system for monitoring moisture penetration in a conventional communications cable, provided that the cable is equipped with at least one conductive armour layer. Where the cable has a conductive component of this type, the invention can use it to communicate between a central office terminal, a terminating resistor and remote sensors in splice enclosures along the cable. A DC current through the conductor, the terminating resistor and a ground return path provide for end-to-end monitoring of the cable. An allowable current "window" is established and if the current exceeds a pre-set value, this indicates a short in the system, such as through moisture penetration. A current below a minimum value indicates an open circuit in the conductor.

Using this technique, moisture penetration can be monitored in conventional communications cable without special moisture-detection conductors.

Because the armour layer is within the protective sheath, just inside the outer plastic jacket, moisture penetration is detected much earlier than with the prior art, which required moisture penetration through the entire sheath to the core before it could be sensed. Physical damage to the armour layer is also monitored, which can occur without moisture penetration. By using a negative potential line signal on the cable armour, the armour is cathodically protected so that corrosion is inhibited even in the event of moisture penetration of the jacket.

The present invention aims at an improved system of this type.

SUMMARY

According to one aspect of the present invention there is provided a method of monitoring a communications cable having a core, a protective sheath surrounding the core, including a waterproof outer jacket surrounding a metallic armour layer, said method comprising generating a fixed voltage DC line signal, applying the line signal to one end of an electric circuit comprising the metallic armour layer, a ground return path and terminating resistor means electrically connecting the armour layer and the return path at an opposite end of the electric circuit and monitoring changes in the line signal current, whereby increased line signal current indicates moisture penetration of the jacket and decreased line signal current indicates damage to the armour layer.

According to another aspect of the present invention there is provided a system for monitoring a communications cable having a core, a protective sheath surrounding the core, including a waterproof outer jacket surrounding a metallic armour layer, said system comprising terminating resistor means at one end of the cable electrically connecting one end of the metallic armour layer to ground, a line signal generating means connected to an opposite end of the armour layer and to ground for applying a fixed voltage DC line signal to the armour layer, and means for monitoring changes in the line signal current whereby increased line signal current indicates moisture penetration of the jacket and decreased line signal current indicates damage to the armour layer.

The line signal preferably maintains the armour at a negative potential with respective ground, providing the cable with cathodic protection.

BRIEF DESCRIPTION OF THE DRAWINGS

In the accompanying drawings, which illustrate exemplary embodiments of the present invention.

DETAILED DESCRIPTION

Figure 1:
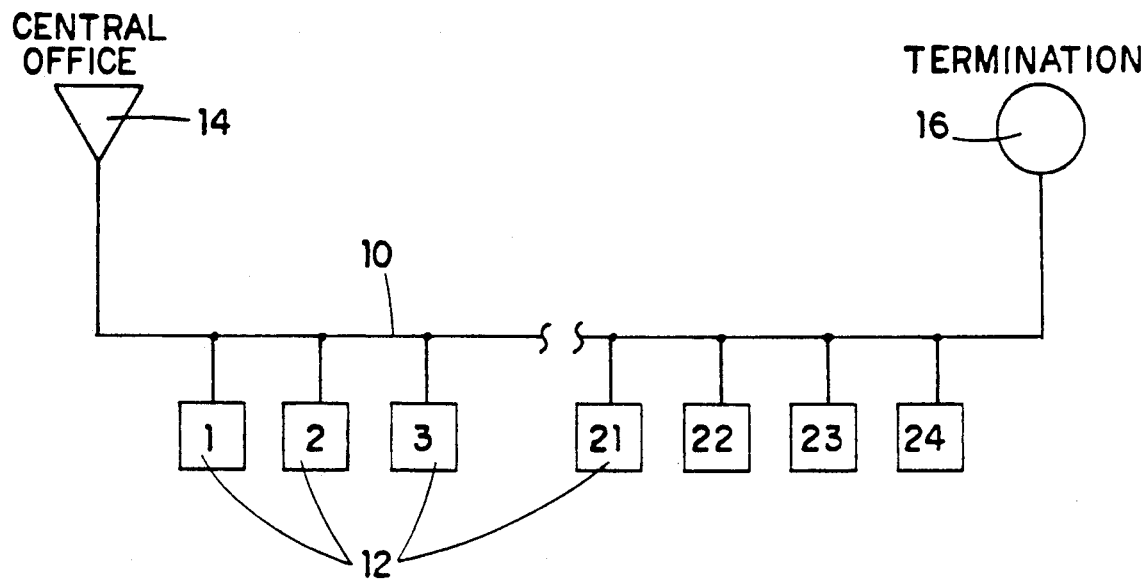
FIG. 1 is a schematic illustration of a monitored trunk cable.

Referring to the accompanying drawings, FIG. 1 illustrates a typical monitored trunk cable run. The illustrated cable 10 has twenty-four splices, each housed in a splice closure 12. The system is monitored from the central office unit 14 at one end of the line while a detection line termination 16 is found at the other end of the line. While not illustrated, the system may also be used to monitor feeder cables with branch cable runs. The detection lines for branch cables are half tapped into the main cable detection line at the splice points.

Figure 2:
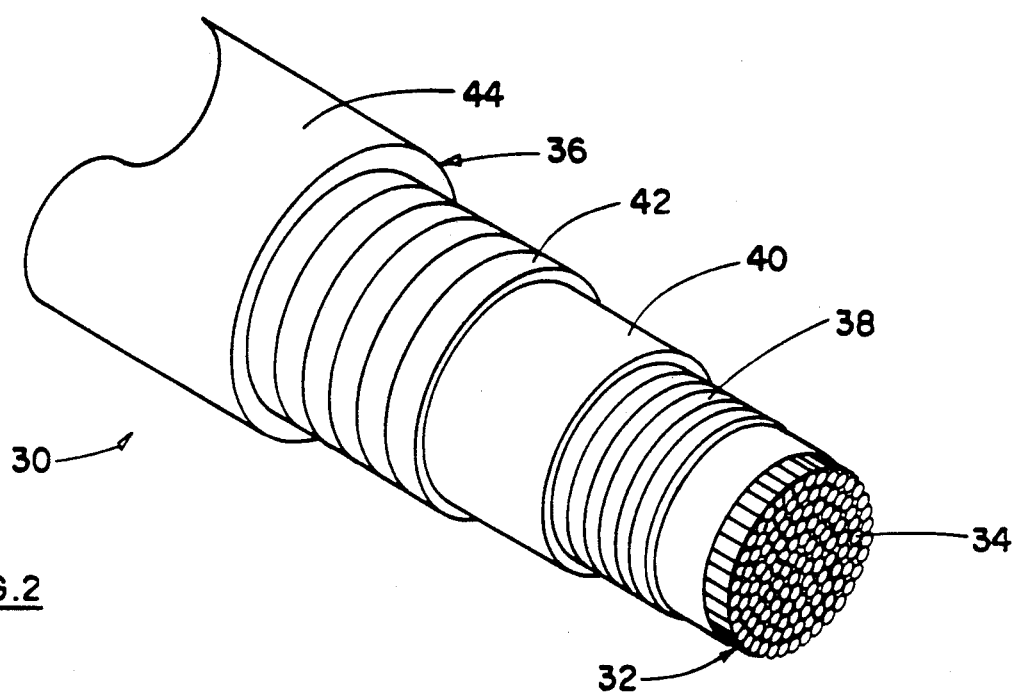
FIG. 2 illustrates the construction of a conventional communications cable.

FIG. 2 illustrates a convention communications cable 30. The cable has a core 32 containing the wire pairs 34 used for carrying the communication signals. The core is surrounded by a composite sheath 36. The sheath includes a metal shield layer 38 that is in turn covered by an insulation layer 40. The outer steel armour layer 42 covers insulation 40 and is itself covered by polyethylene outer jacket 44.

Figure 3:
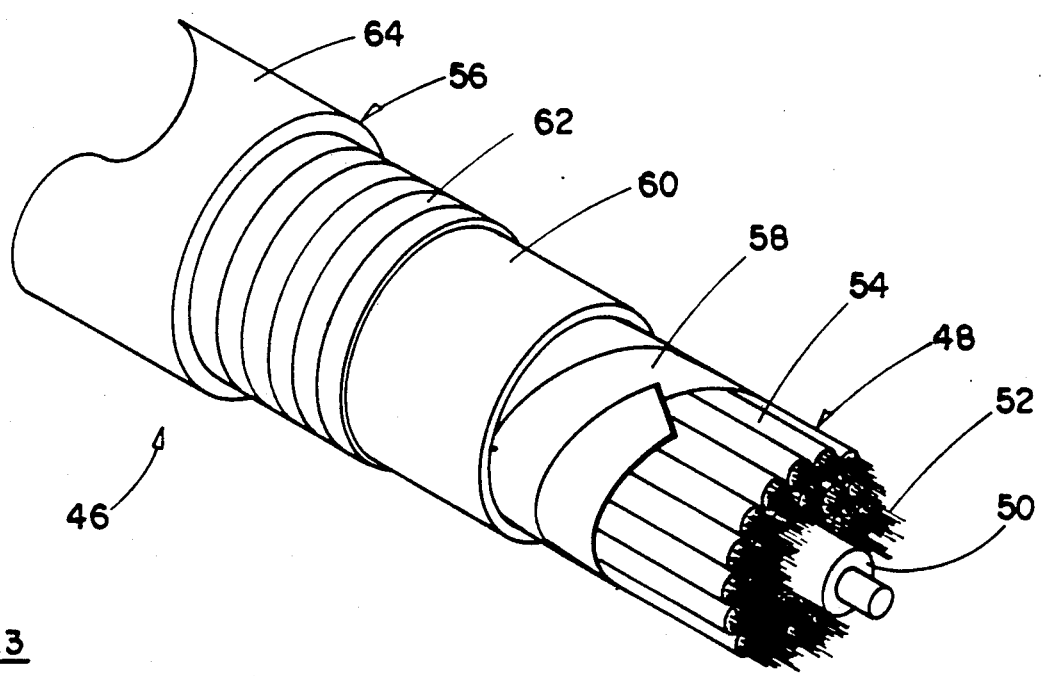
FIG. 3 is a illustrates the construction of a fibre optic cable of known type.

FIG. 3 is an illustration like FIG. 2 showing a fibre optic cable 46. The cable has a core 48 containing a central strength number 50 surrounded by optical fibres 52 contained in buffer tubes 54. The sheath 56 includes layer of binder tape 58 covered by an inner polyethelene jacket 60, a steel armour layer 62 and an outer polyethelene jacket 64.

Figure 4:
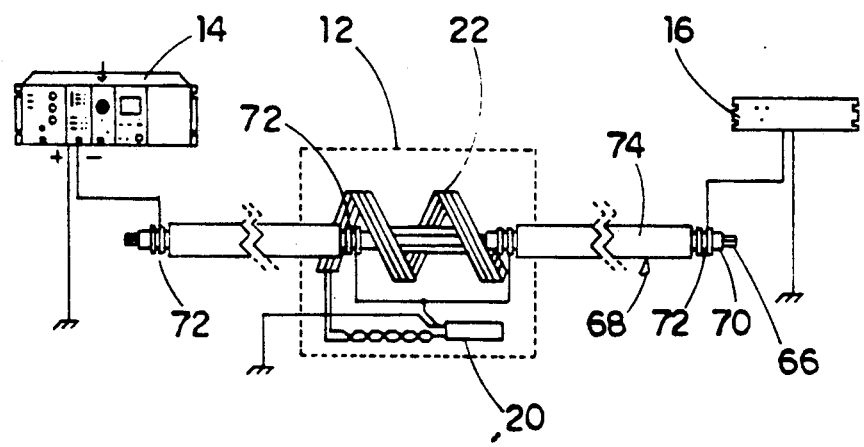
FIG. 4 is a schematic illustration of a system according to the present invention using a steel armour and an earth return as moisture detecting conductor.

In cables such as those in FIGS. 2 and 3, it is of importance to detect the presence of moisture in the cable at an early stage, before service has been interrupted. To achieve this, the present invention uses a monitoring system like that illustrated in FIG. 4. The cable illustrated in that drawing is shown having a core 66 and a sheath 68, with the sheath including an inner jacket 70, a metal armour layer 72 and an outer polyethelene jacket 74. The armour layer 72 is connected to the central office unit 14 and the terminating resistor 16 at opposite ends of the cable. The office unit 14 and the resistor 16 are grounded to provide a ground return path. In each splice enclosure 12, there is a remote sensor 20 connected to a moisture detection tape 22 that is wrapped around the splice bundle. When water contacts the tape, the remote sensor is triggered to transmit a digitally encoded alarm signal to the office terminal 14 through the armour layer 72. The terminal equipment 14 intercepts, decodes, and displays the exact location of the trouble.

A pre-determined DC voltage with respect to the ground is applied to the cable armour by the central office unit. This provides a "nominal" DC line current through the armour and resistor 16 with a return path through ground. The current is continuously monitored by the central office unit 14. An operating window is established and line current deviation beyond the set limits results in specific alarm conditions. These include a Line alarm that results if the detection line current drops below a set value, indicating that an "open" has occurred in the cable system usually indicating damage to the armour. A cable alarm occurs if the detection line current increases beyond another set value and indicates that water has entered the cable and produced a current leakage path to ground. A splice sensor unit (SSU) alarm is generated if several impulses are present on the detection line indicating that water has entered a monitored location, such as splice, and has triggered a remote sensor.

The monitored armour layer thus serves as a sensing element providing complete end to end monitoring of the cable. The DC voltage applied to the armour maintains the armour at a negative potential with respect to ground, so that the cable is cathodically protected.

While certain embodiments of the invention have been described in the foregoing, it is to be understood that other embodiments are possible within the scope of the inventions, which should be ascertained solely by reference to the accompanying claims.

We claim:

1. A method of monitoring a communications cable having a core, a protective sheath surrounding the core, including a waterproof outer jacket surrounding a metallic armour layer, said method comprising generating a fixed voltage DC line signal, applying the line signal to one end of an electric circuit consisting of the metallic armour layer, a ground return path and terminating resistor means electrically connecting the armour layer and the ground return path at an opposite end of the electric circuit and monitoring changes in the line signal current, whereby increased line signal current indicates moisture penetration of the jacket and decreased line signal current indicates damage to the armour layer.

2. A method according to claim 1 including applying to the cable armour a DC signal with a negative potential with respect to ground.

3. A system for monitoring a communications cable having a core, a protective sheath surrounding the core, including a waterproof outer jacket surrounding a metallic armour layer, said system comprising terminating resistor means at one end of the cable electrically connecting one end of the metallic armour layer to ground, a line signal generating means connected to an opposite end of the armour layer and to ground, the generating means being electrically connected to the terminating resistor only by the armour layer and a ground return path for applying a fixed voltage DC line signal to the armour layer, and means for monitoring changes in the line signal current whereby increased line signal current indicates damage to the armour layer.

4. A system according to claim 3 wherein the signal generating means comprise means for applying a direct current signal to the armour layer of the cable, with a negative potential with respect to ground.

* * * * *